(12) United States Patent
Georgi et al.

(10) Patent No.: US 9,327,594 B2
(45) Date of Patent: May 3, 2016

(54) ACCESS SYSTEM FOR VEHICLE ENERGY STORAGE DEVICE WITH MAGNETIC SENSOR TO DETECT ACCESS DOOR POSITION

(71) Applicant: GM GLOBAL TECHNOLOGY OPERATIONS LLC, Detroit, MI (US)

(72) Inventors: Christopher J. Georgi, Rochester Hills, MI (US); Robert Dallos, Jr., Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 61 days.

(21) Appl. No.: 13/967,677

(22) Filed: Aug. 15, 2013

(65) Prior Publication Data

US 2015/0048644 A1    Feb. 19, 2015

(51) Int. Cl.
| | | |
|---|---|---|
| *B60K 15/05* | (2006.01) | |
| *B60L 11/18* | (2006.01) | |
| *E05B 77/54* | (2014.01) | |
| *H01H 36/00* | (2006.01) | |
| *H03K 17/97* | (2006.01) | |

(52) U.S. Cl.
CPC ............ *B60K 15/05* (2013.01); *B60L 11/1818* (2013.01); *E05B 77/54* (2013.01); *H01H 36/00* (2013.01); *H03K 17/97* (2013.01); *B60K 2015/0546* (2013.01)

(58) Field of Classification Search
CPC .......... B60K 15/05; B60K 2015/0515; B60K 2015/053; B60K 2015/0538; B60K 2015/0546; B60K 2015/0553; B60K 2015/0561; B60L 11/1809; B60L 11/1812

USPC ........................................................ 296/97.22
See application file for complete search history.

(56) References Cited

U.S. PATENT DOCUMENTS

| | | | |
|---|---|---|---|
| 5,906,405 A * | 5/1999 | Cooper ...................... | 296/97.22 |
| 6,007,141 A * | 12/1999 | Thomas et al. ............... | 296/155 |
| 6,808,226 B2 * | 10/2004 | Hirano .......................... | 296/155 |
| 6,834,688 B2 * | 12/2004 | Ono et al. ...................... | 141/94 |
| 7,185,938 B2 * | 3/2007 | Beck .......................... | 296/97.22 |
| 8,122,984 B2 * | 2/2012 | Miwa et al. ................. | 180/65.27 |
| 8,353,553 B2 | 1/2013 | Beck | |
| 8,382,187 B2 * | 2/2013 | Guendouz et al. ......... | 296/97.22 |
| 2003/0062741 A1 | 4/2003 | Joerg et al. | |
| 2011/0146157 A1* | 6/2011 | Bauer ............................. | 49/31 |
| 2013/0076059 A1* | 3/2013 | Zalan et al. ................ | 296/97.22 |
| 2013/0158744 A1* | 6/2013 | Inoue et al. ...................... | 701/2 |
| 2015/0048644 A1* | 2/2015 | Georgi et al. ............... | 296/97.22 |

* cited by examiner

*Primary Examiner* — Gregory Blankenship
(74) *Attorney, Agent, or Firm* — Quinn Law Group, PLLC

(57) ABSTRACT

An access system for a vehicle energy storage device includes a housing and an access port in the housing configured for operative communication with the energy storage device. An access door is operatively connected to the housing and is movable between a closed position in which the access door closes the housing, and an open position in which the access door opens the housing. The access door prevents access to the access port in the closed position and permits access to the access port in the open position. A magnet is operatively connected to one of the housing and the access door. A magnetic sensor is operatively connected to the other one of the housing and the access door and detects the proximity of the magnet relative to the sensor. The sensor is operable to provide a signal indicative of whether the access door is in the closed position.

17 Claims, 4 Drawing Sheets

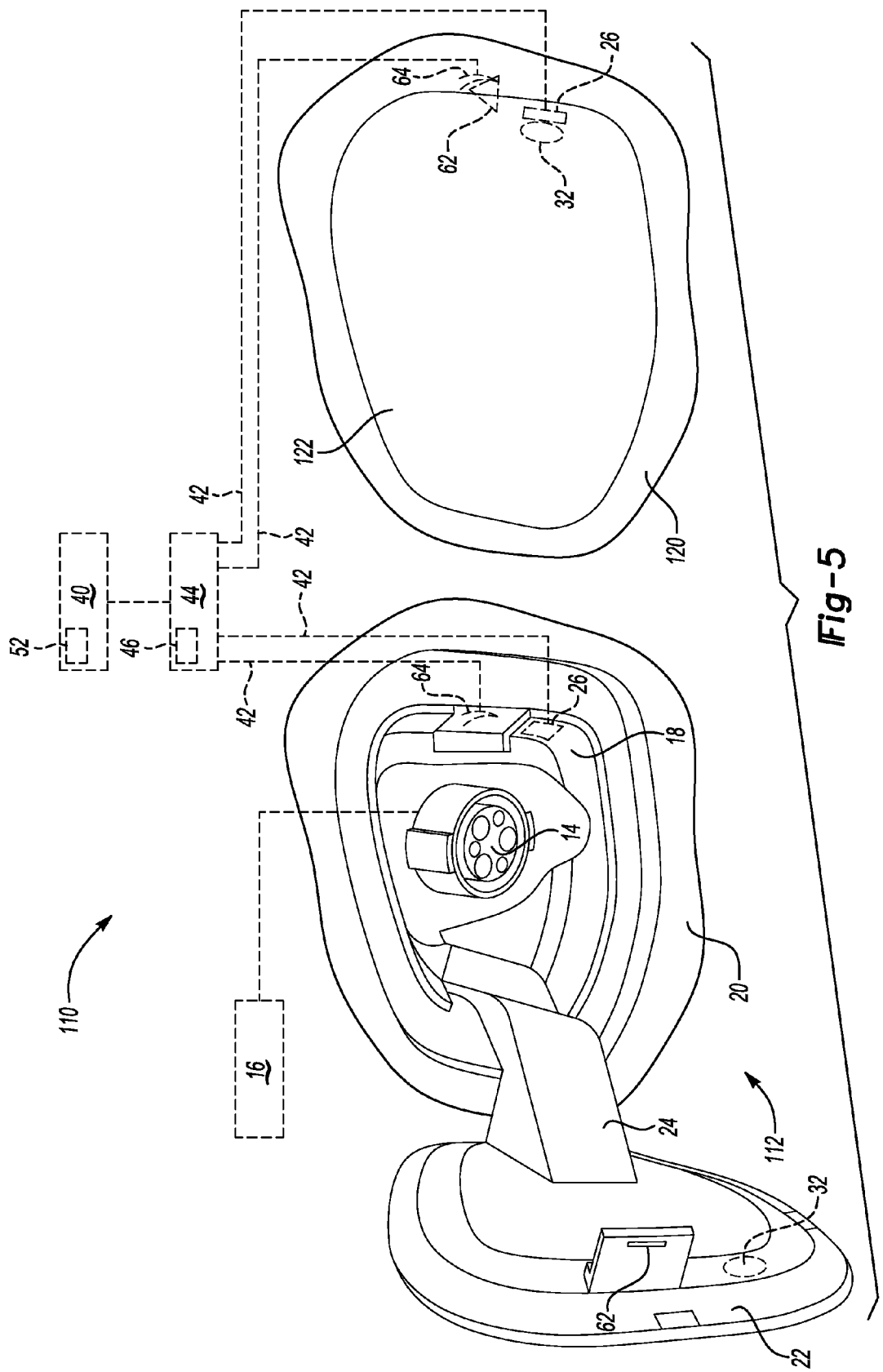

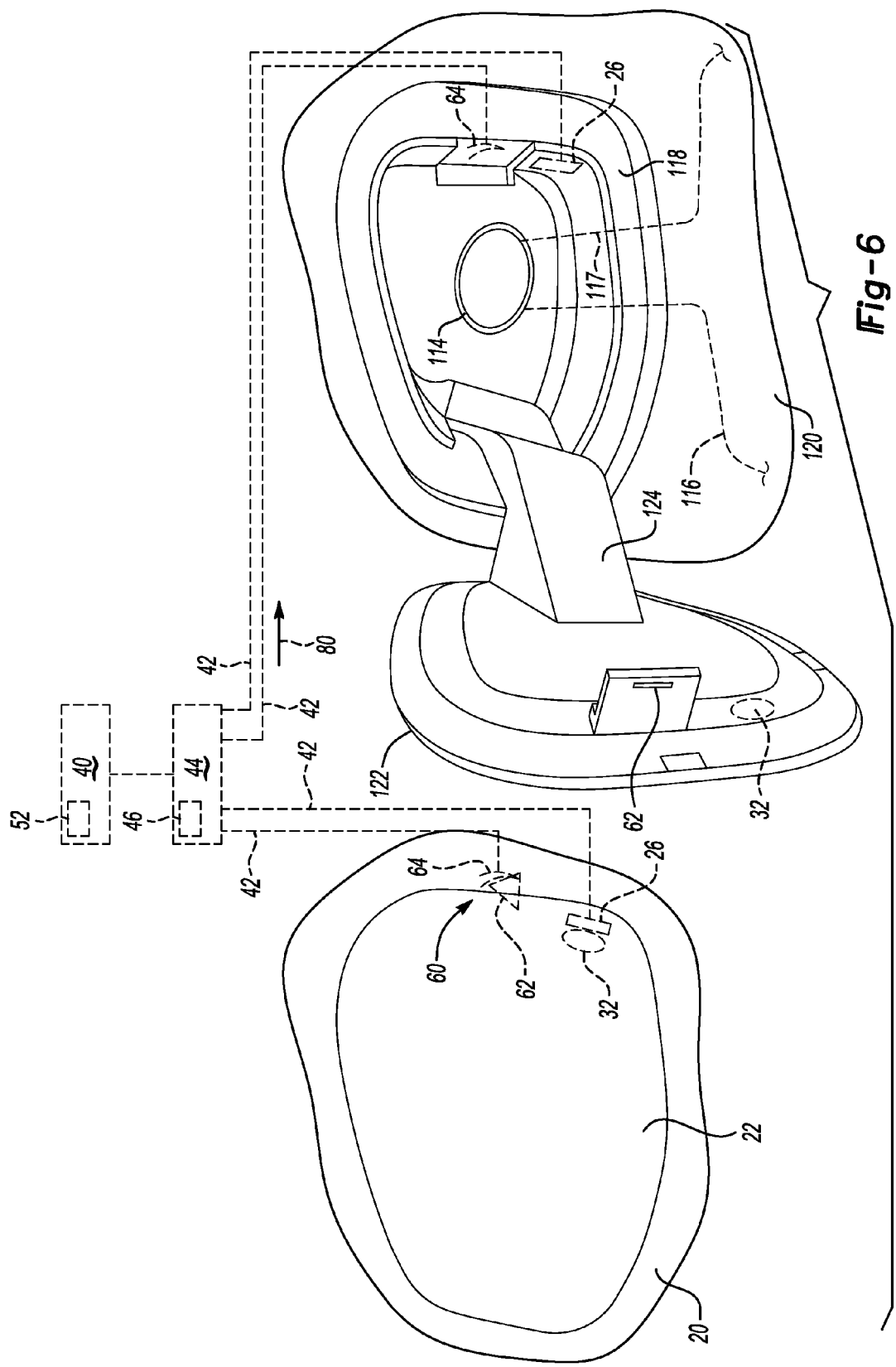

ACCESS SYSTEM FOR VEHICLE ENERGY STORAGE DEVICE WITH MAGNETIC SENSOR TO DETECT ACCESS DOOR POSITION

TECHNICAL FIELD

The present teachings generally include an access system for a vehicle energy storage device with a magnetic sensor to detect an access door position.

BACKGROUND

Modern vehicles often have access doors that cover an access port for a vehicle energy storage device. For example, a fuel filler door covers the fuel fill port of a fuel filler neck of a fuel tank. The fuel filler door must be opened in order to fill the fuel tank. On many vehicles, a latch assembly latches the fuel filler door closed. Some latch assemblies are releasable by activation of a switch, or with a key.

Electric vehicles and hybrid electric vehicles often have an electric charge port for charging an electric battery with an offboard power source (i.e., a power source not located on the vehicle). A charge port door usually covers the charge port and must be opened to access the charge port to charge the battery. A latch assembly can be used to latch the charge port door closed.

In some vehicles, a mechanical switch is used to detect the open/close status of a charge port door or a fuel fill door. One system uses a push-push spring assembly with a Hall-effect sensor to detect the open/close status of the door. A pin on the door interfaces with the sensor. These known switches and assemblies have moving parts and require contact and interfacing between a component of the door and a component of the vehicle body or housing of the port in order to determine the open/close status.

SUMMARY

An access system for a vehicle energy storage device includes a housing and an access port in the housing. The access port is configured for operative communication with the energy storage device. An access door is operatively connected to the housing and is configured to be movable between a closed position in which the access door closes the housing, and an open position in which the access door opens the housing. The access door thereby prevents access to the access port in the closed position and permits access to the access port in the open position. A magnet is operatively connected to one of the housing and the access door. A magnetic sensor is operatively connected to the other one of the housing and the access door and is operable to detect the proximity of the magnet relative to the sensor. The sensor is operable to provide a signal indicative of whether the access door is in the closed position. In some embodiments, the sensor is operatively connected to a vehicle information center, and the signal causes a sensory alert at the vehicle information center, such as a display light or an audible alert. A vehicle operator is thus alerted to the position of the access door.

Detection of the access door position and an indication of the position to a vehicle operator enables the operator to close an access door that was inadvertently left open. The magnetic sensor and the magnet have no moving parts and need not contact one another; the magnetic sensor operates based only on the proximity of the magnet.

In one embodiment, the energy storage device is a first energy storage device, and the vehicle has a second energy storage device. For example, the first energy storage device may be a fuel tank, and the second energy storage device may be a battery. An access port in a second housing is configured for operative communication with the second energy storage device. A second access door is operatively connected to the second housing. The second access door is configured to be movable between a closed position in which the second access door closes the second housing, and an open position in which the second access door opens the second housing. The second access door thereby prevents access to the second access port in the closed position and permits access to the second access port in the open position.

A latch assembly may be used that is operable to latch the second access door to the second housing to keep the second access door in the closed position, and releasable to permit movement of the second access door to the open position. The latch assembly is operatively connected to the magnetic sensor of the first housing and the first access door, and is configured to release if a signal from the magnetic sensor indicates that the first access door is in the closed position. Thus, access to the second energy storage device is dependent upon the position of the access door of the first energy storage device.

The above features and advantages and other features and advantages of the present teachings are readily apparent from the following detailed description of the best modes for carrying out the present teachings when taken in connection with the accompanying drawings.

BRIEF DESCRIPTION OF THE DRAWINGS

FIG. 5 is a schematic illustration in fragmentary perspective view of a vehicle with a second embodiment of an access system for two separate energy storage devices, showing one access door in an open position and another access door latched in a closed position.

FIG. 6 is a schematic illustration in fragmentary perspective view of the vehicle and access system for FIG. 5, showing one access door latched in a closed position and another access door in an open position.

DETAILED DESCRIPTION

Figure 1:
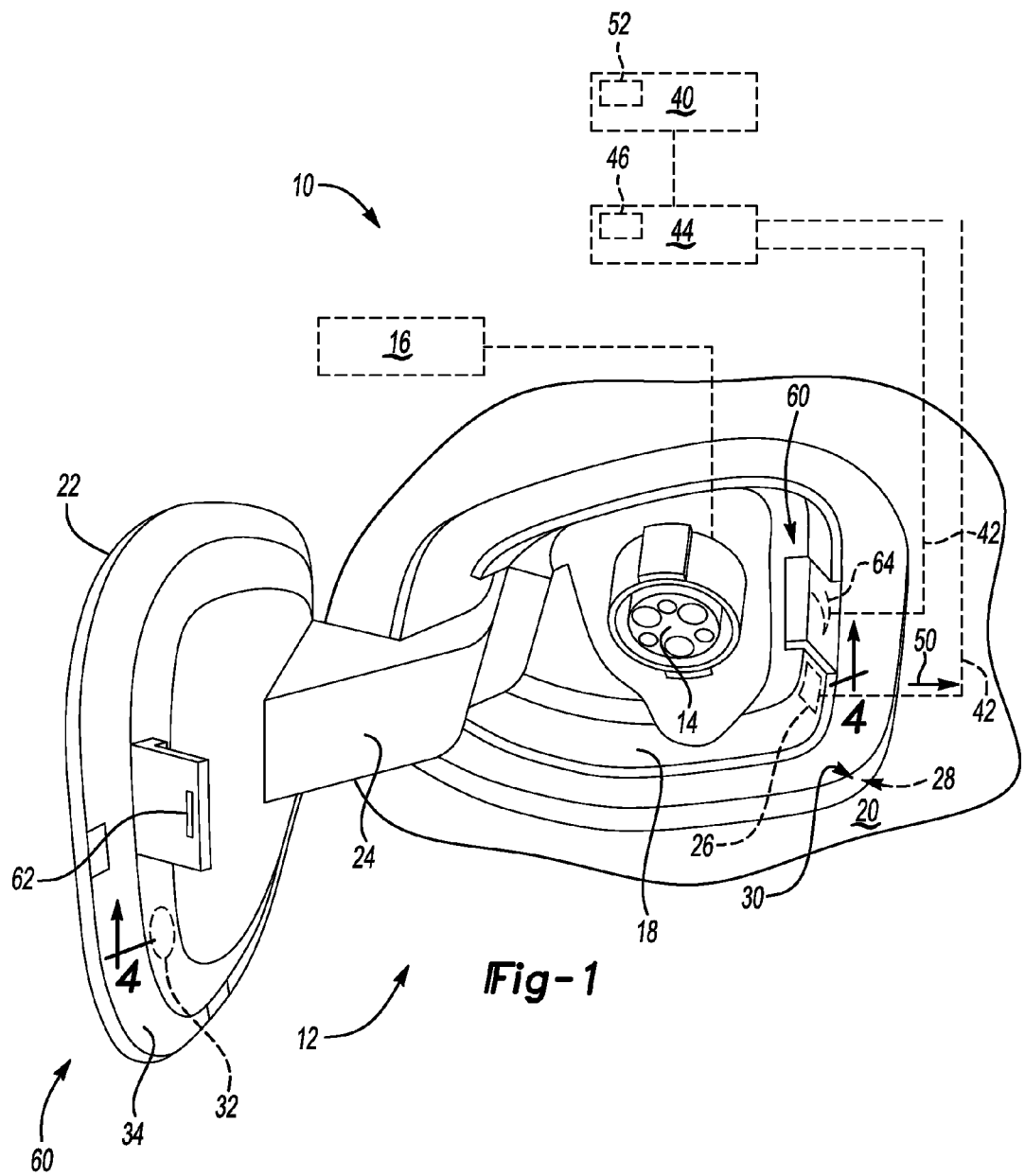
FIG. 1 is a schematic illustration in fragmentary perspective view of a vehicle with a first embodiment of an access system for an energy storage device, showing an access door in an open position relative to a housing with an access port.

Referring to the drawings, wherein like reference numbers refer to like components throughout the several views, FIG. 1 shows a portion of a vehicle 10 that includes an access system 12 for accessing a charge port 14. The charge port 14 is also referred to herein as an access port. The charge port 14 is configured to be connectable to an electrical charger (not shown) in order to recharge a battery 16 on the vehicle 10. The battery 16 is secured on the vehicle 10 and is electrically connected to the charge port 14 so that it is in operative communication with the charge port 14, as is understood by those skilled in the art. The charge port 14 is secured in a housing 18 supported by a vehicle panel 20. The charge port 14 can be secured to the housing 18 in any manner, such as via an interference fit with a rubber portion of the housing 18.

Figure 2:
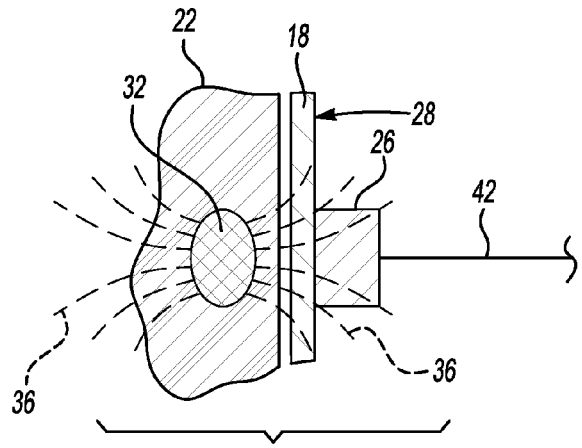
FIG. 2 is a schematic illustration in fragmentary cross-sectional view of the access door and housing of FIG. 1, with the access door closed and a magnetic sensor providing a signal.
Figure 3:
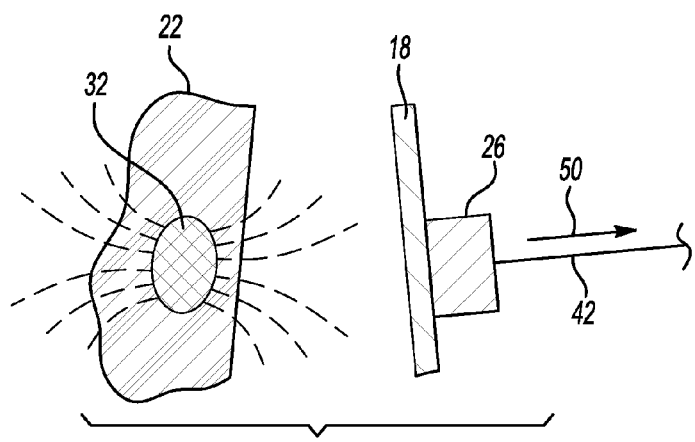
FIG. 3 is a schematic illustration in fragmentary cross-sectional view of the access door and housing of FIG. 1, with the access door partially open.
Figure 4:
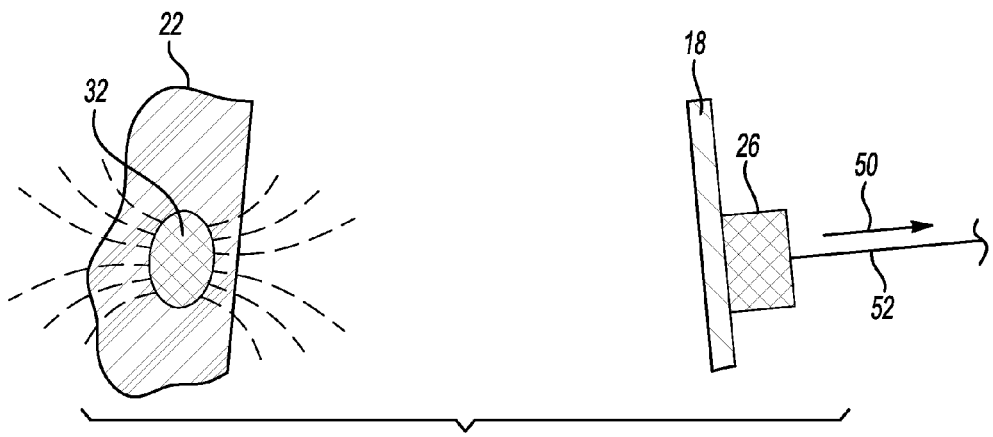
FIG. 4 is a schematic illustration in fragmentary cross-sectional view of the access door and housing of FIG. 1 taken at the lines 4-4 of FIG. 1, with the access door fully open.

A charge port door 22 is operatively connected to the housing 18. The charge port door 22 is referred to herein as an access door, as it is configured to be movable between a closed position (shown in FIG. 2), and an open position (shown in FIGS. 1 and 4). The charge port door 22 is also positionable anywhere between the closed position of FIG. 2 and the open position of FIG. 4, as represented by the intermediate position of FIG. 3. In the closed position, the charge port door 22 closes the housing 18 to cover the charge port 14 and prevent access to the charge port 14. In the open position, the charge port door 22 opens the housing 18 and permits access to the charge port 14. In the embodiment shown, the charge port door 22 is hinged to the housing 18 by a hinge portion 24 of the door 22. In other embodiments, a different pivotable connection can be used. The charge port door 22 can be an assembly of metal and plastic components.

The access system 12 includes a magnetic sensor 26 secured to the housing 18. In the embodiment shown, the magnetic sensor 26 is secured to the housing 18 at an inner surface 28 of the housing 18 by any suitable means such as fasteners (not shown), welding, adhesive bonding, or otherwise. In other embodiments, the magnetic sensor 26 could be secured to the housing 18 at an outer surface 30 facing the door 22, or could be embedded within the housing 18.

The access system 12 also includes a magnet 32 that is operatively connected to the charge port door 22. In the embodiment shown, the magnet 32 is secured to or contained in an injection-molded plastic portion 34 of the door 22. In other embodiments, the magnetic sensor 26 can be secured to the door 22 and the magnet 32 can be secured to the housing 18. In the embodiment shown, the magnet 32 is in a cover portion of the door 22. In other embodiments, the magnet 32 (or the magnetic sensor 26) can be in the hinge portion 24 of the door 22, and the magnet sensor 26 (or the magnet 32) would then be located at a portion of the housing that is in the vicinity of the hinge portion when the door is closed. The magnetic sensor 26 is operable to detect the proximity of the magnet 32 relative to the sensor 26. For example, the magnetic sensor 26 can include an internal coil (not shown) in proximity to the magnetic field 36 of the magnet 32. When the door 22 is in the closed position shown in FIG. 2, the magnetic flux of the magnet 32 on the sensor 26 is at its greatest level. When the door 22 moves to the intermediate position of FIG. 3, or the open position of FIG. 4, the sensor 26 changes its position in the magnetic field 36, or is completely outside of the magnetic field 36, causing a change in magnetic flux and inducing a current in the coil of the sensor 26 according to Lenz's law, as is understood by those skilled in the art.

Referring to FIG. 1, the magnetic sensor 26 is operatively connected to a vehicle information center 40 by one or more electrical conductors 42, such as wiring. The vehicle information center 40 may be a display center located in a vehicle instrument panel of the vehicle 10. Optionally, the connection to the vehicle information center 40 can be through an electronic controller 44 that has a processor 46. If the door 22 is in the closed position and is opened, the change in current induced in the magnetic sensor 26 triggers the signal 50, causing the alert by the alert feature 52. The current induced in the magnetic sensor 26 causes the sensor 26 to provide a sensor signal 50 (indicated in FIGS. 3-4) along the electrical conductor 42. In response to the signal 50, whether the signal 50 is provided through the controller 44 to the vehicle information center 40 or is provided directly to the vehicle information center 40, an alert feature 52 of the vehicle information center 40 is activated. The alert feature 52 provides a sensory alert, such as a visually displayed message or auditory message indicating that the door 22 is open. In other words, the sensory alert can be the lighting of a display light or the transmission of a sound. The alert feature 52 serves as a prompt to the vehicle operator to place the charge port door 22 in the closed position.

As shown in FIG. 1, the access system 12 optionally includes a latch assembly 60 that has a striker feature 62 carried on the door 22, and a movable latch 64 secured to the housing 18. In other embodiments, the latch 64 could be carried on the door 22 and the striker feature 62 could be secured to the housing 18. The latch 64 is operatively connected to the electronic controller 44 by one or more transfer conductors 42, and can be activated by the electronic controller 44 to latch the door 22 when the processor 46 determines that the door 22 should be latched to the housing 18 to prevent access to the charge port 14. Latching may occur automatically when the door 22 moves to the closed position. Unless the latch 64 is released, the door 22 cannot be opened.

FIGS. 5-6 show another embodiment of a vehicle 110 with an access system 112 that has all of the components of the access system 12 of FIG. 1, as well as a fuel filler port 114 and fuel filler door 122. The vehicle 110 is a hybrid vehicle that has two energy storage devices. Specifically, the vehicle 110 includes both the battery 16, and a fuel tank 116, indicated partially in hidden lines in FIG. 6. As used herein, the fuel tank is referred to as a first energy storage device, and the battery is referred to as a second energy storage device. The fuel filler port 114 is an opening at an end of a fuel fill tube 117 that empties into the fuel tank 116. The fuel filler door 122 is operatively connected by a hinged portion 124 to a housing 118 supported in another body panel 120 of the vehicle 110, or in other embodiments in the same body panel 20 as the housing 18.

The fuel filler door 122 is configured to be movable between a closed position shown in FIG. 5, in which the fuel filler door 122 closes the housing 118, and an open position shown in FIG. 6 in which the fuel filler door 122 opens the housing 118. The fuel filler door 122 thereby prevents access to the fuel tank filler port 114 in the closed position and permits access to the fuel tank filler port 114 in the open position.

A magnetic sensor 26 substantially identical to the magnetic sensor 26 secured to the housing 18 is secured to the housing 118, and a magnet 32 substantially identical to the magnet 32 secured to the charge port door 22 is secured to the fuel filler door 122. Additionally, a latch assembly 60 substantially identical to the latch assembly 60 of the charge port door 22 and housing 18 has a portion with a striker feature 62 carried on the door 122 and a movable latch 64 supported on the housing 118. In other embodiments, the latch 64 could be carried on the door 122 and the striker feature 62 could be supported on the housing 118. The magnetic sensor 26 and the latch 64 of the housing 118 are operatively connected to the controller 44 and the vehicle information center 40.

As used herein, the housing 118 is referred to as a first housing, the fuel filler port 114 is referred to as a first access port, the fuel filler door 122 is referred to as a first access door, and the magnetic sensor 26 and the magnet 32 on the door 122 and housing 118 are referred to as a first magnetic sensor and as a first magnet, respectively. The latch assembly 60 used on the door 122 and housing 118 is referred to as a second latch assembly. The housing 18 is referred to as a second housing, the fuel filler port 14 is referred to as a second access port, the fuel filler door 22 is referred to as a second access door, and the magnetic sensor 26 and the magnet 32 are referred to as a second magnetic sensor and as a second magnet, respectively. The latch assembly 60 used on the door 22 and housing 18 is referred to as a first latch assembly.

Both of the magnetic sensors 26 are operatively connected to the controller 44 and to the vehicle information center 40. If the controller 44 determines from the signal 50 provided from the sensor 26 on the charge port housing 18 that the charge port door 22 is not in the closed position, then a sensory alert 52 is provided by the vehicle information sensor 40 alerting the vehicle operator that the charge port door 22 is open, and the controller 44 will not activate the latch 64 of the fuel filler housing 118. In other words, the magnetic sensor 26 of the fuel filler housing 118 is configured to release only if the signal 50 from the sensor 26 on the charge port housing 18 indicates that the charge port door 22 is in the closed position. In FIG. 5, the charge port door 22 is open. Accordingly, the fuel filler door 122 will remain in the closed position, latched to the housing 118 by the latch assembly 60.

In FIG. 6, the charge port door 22 is closed. If a vehicle operator wishes to open the fuel filler door 122, as can be indicated by pressing a release button (not shown) or by some other action by the vehicle operator, the controller 44 will determine that the charge port door 22 is closed, and send an activation signal 80 to the latch assembly 60 of the fuel filler housing 118 and fuel filler door 122 to release the latch 64 and allow the fuel filler door 122 to be opened, as shown in FIG. 6.

Similarly, if a vehicle operator wishes to open the charge port door 22 and the fuel filler door 122 is already opened, then a sensory alert 52 is provided by the vehicle information sensor 40 alerting the vehicle operator that the fuel filler door 122 is open, and the controller 44 will not activate the latch 64 of the charge port housing 18. In other words, the latch 64 of the charge port housing 18 is configured to release only if the signal 50 from the sensor 26 on the fuel filler housing 118 indicates that the fuel filler door 122 is in the closed position. In FIG. 6, the fuel filler door 122 is open. Accordingly, the charge port door 22 will remain in the closed position, latched to the housing 18 by the latch assembly 60.

While the best modes for carrying out the many aspects of the present teachings have been described in detail, those familiar with the art to which these teachings relate will recognize various alternative aspects for practicing the present teachings that are within the scope of the appended claims.

The invention claimed is:

1. An access system for a vehicle energy storage device comprising:
   a housing;
   an access port in the housing; wherein the access port is configured for operative communication with the energy storage device;
   an access door operatively connected to the housing; wherein the access door is configured to be movable between a closed position in which the access door closes the housing, and an open position in which the access door opens the housing; the access door thereby preventing access to the access port in the closed position and permitting access to the access port in the open position;
   a magnet operatively connected to one of the housing and the access door;
   a magnetic sensor operable to detect proximity of the magnet relative to the magnetic sensor; wherein the magnetic sensor is operatively connected to the other one of the housing and the access door; wherein the magnetic sensor is operable to provide a signal indicative of whether the access door is in the closed position;
   wherein the energy storage device is a first energy storage device, and the vehicle has a second energy storage device; wherein the housing is a first housing, the access port is a first access port, and the access door is a first access door; and further comprising:
   a second housing;
   a second access port in the second housing; wherein the second access port is configured for operative communication with the second energy storage device;
   a second access door operatively connected to the second housing; wherein the second access door is configured to be movable between a closed position in which the second access door closes the second housing, and an open position in which the second access door opens the second housing, the second access door thereby preventing access to the second access port in the closed position and permitting access to the second access port in the open position;
   a latch assembly operable to latch the second access door to the second housing to keep the second access door in the closed position, and releasable to permit movement of the second access door to the open position; wherein the latch assembly includes a striker feature on the second access door and a latch secured to the second housing;
   wherein the latch assembly is operatively connected to the magnetic sensor that is operatively connected to the other one of the first housing and the first access door; and wherein the latch assembly is configured to release only if the signal indicates that the first access door is in the closed position.

2. The access system of claim 1, further comprising:
   a vehicle information center; wherein the first magnetic sensor is operatively connected to the vehicle information center;
   wherein the signal is provided from the first magnetic sensor to the vehicle information center; and
   wherein the vehicle information center is operable to provide a sensory alert in response to the signal.

3. The access system of claim 1, wherein the first access port is a fuel filler tube entrance; and wherein the first access door is a fuel filler door.

4. The access system of claim 1, wherein the first access port is a charge port; and wherein the first access door is a charge port door.

5. The access system of claim 1, wherein the first energy storage device is a fuel tank and the second energy storage device is a battery; wherein the magnet is a first magnet and the magnetic sensor is a first magnetic sensor; and further comprising:
   a second magnet operatively connected to one of the second housing and the second access door;
   a second magnetic sensor operable to detect proximity of the second magnet relative to the second magnetic sensor; wherein the second magnetic sensor is operatively connected to the other one of the second housing and the second access door; wherein the second magnetic sensor is operable to provide a signal indicative of whether the second access door is in the closed position;
   a second latch assembly operable to latch the first access door to the first housing to keep the first access door in the closed position, and releasable to permit movement of the first access door to the open position; wherein the second latch assembly includes a striker feature on the first access door and a latch secured to the first housing; and wherein the second latch assembly is operatively connected to the second magnetic sensor and is configured to release only if the signal from the second magnetic sensor indicates that the second access door is in the closed position.

6. The access system of claim 1, wherein the first access door has a hinge portion and is hinged to the first housing at the hinge portion.

7. The access system of claim 6, wherein the first energy storage device is a fuel tank and the second energy storage device is a battery; wherein the magnet is a first magnet and the magnetic sensor is a first magnetic sensor; wherein the second access door has a hinge portion and is hinged to the second housing at the hinge portion of the second access door; and further comprising:

a second magnet in the second access door;

a second magnetic sensor operable to detect proximity of the second magnet relative to the second magnetic sensor; wherein the second magnetic sensor is operatively connected to the second housing; wherein the second magnetic sensor is operable to provide a signal indicative of whether the second access door is in the closed position;

a second latch assembly operable to latch the first access door to the first housing to keep the first access door in the closed position, and releasable to permit movement of the first access door to the open position; wherein the second latch assembly includes a striker feature on the first access door and a latch secured to the first housing; and wherein the second latch assembly is operatively connected to the second magnetic sensor and is configured to release only if the signal from the second magnetic sensor indicates that the second access door is in the closed position.

8. The access system of claim 1, wherein the sensor is on an inner surface of the first housing.

9. The access system of claim 1, wherein the magnet is contained in the first access door.

10. An access system for a vehicle, the access system comprising:

a first housing;

a fuel tank filler port in the first housing;

a fuel filler door operatively connected to the first housing; wherein the fuel filler door is configured to be movable between a closed position in which the fuel filler door closes the first housing, and an open position in which the fuel filler door opens the first housing, the fuel filler door thereby preventing access to the fuel tank filler port in the closed position and permitting access to the fuel tank filler port in the open position; wherein the fuel filler door has a hinge portion and is hinged to the first housing at the hinge portion of the fuel filler door;

a first magnet operatively connected to the fuel filler door;

a first magnetic sensor operable to detect proximity of the first magnet relative to the first magnetic sensor; wherein the first magnetic sensor is operatively connected to the first housing; wherein the first magnetic sensor is operable to provide a signal indicative of whether the fuel filler door is in the closed position;

a fuel filler door latch assembly operable to keep the fuel filler door in the closed position and releasable to permit movement of the fuel filler door to the open position;

wherein the fuel filler door latch assembly includes a striker feature on the fuel filler door and a latch secured to the first housing;

a second housing;

an electric charge port in the second housing;

a charge port door operatively connected to the second housing; wherein the charge port door is configured to be movable between a closed position in which the charge port door closes the second housing, and an open position in which the charge port door opens the second housing, the charge port door thereby preventing access to the charge port in the closed position and permitting access to the charge port in the open position; wherein the charge port door has a hinge portion and is hinged to the second housing at the hinge portion of the charge port door;

a second magnet operatively connected to the charge port door;

a second magnetic sensor operable to detect proximity of the second magnet relative to the second magnetic sensor; wherein the second magnetic sensor is operatively connected to the second housing; wherein the second magnetic sensor is operable to provide a signal indicative of whether the charge port door is in the closed position;

a charge port door latch assembly operable to keep the charge port door in the closed position and releasable to permit movement of the charge port door to the open position;

wherein the charge port door latch assembly includes a striker feature on the charge port door and a latch secured to the second housing;

wherein the fuel filler door latch assembly is operatively connected to the second magnetic sensor and is configured to release when the signal provided from the second magnetic sensor indicates that the charge port door is closed; and wherein the charge port door latch assembly is operatively connected to the first magnetic sensor and is configured to release when the signal provided from the first magnetic sensor indicates that the fuel filler door is closed.

11. The access system of claim 10, further comprising:

a vehicle information center; wherein the first magnetic sensor and the second magnetic sensor are operatively connected to the vehicle information center; and wherein the vehicle information center is operable to provide sensory alerts in response to the signals.

12. A vehicle comprising:

an energy storage device;

a vehicle body panel;

a housing supported by the vehicle body panel;

an access port in the housing; wherein the access port is in operative communication with the energy storage device;

an access door operatively connected to the housing; wherein the access door is movable between a closed position in which the access door closes the housing, and an open position in which the access door opens the housing, the access door thereby preventing access to the access port in the closed position and permitting access to the access port in the open position;

a magnet operatively connected to the access door;

a magnetic sensor operable to detect proximity of the magnet relative to the magnetic sensor; wherein the magnetic sensor is operatively connected to the housing;

wherein the magnetic sensor is operable to provide a signal indicative of whether the access door is in the closed position;
wherein the energy storage device is a first energy storage device and the vehicle has a second energy storage device; wherein the housing is a first housing, the access port is a first access port, and the access door is a first access door; and further comprising:
a second housing;
a second access port in the second housing; wherein the second access port is in operative communication with the second energy storage device;
a second access door operatively connected to the second housing; wherein the second access door is movable between a closed position in which the second access door prevents access to the second access port, and an open position in which the second access door permits access to the second access port; wherein the second access door covers the second access port in the closed position and uncovers the second access port in the open position;
a latch assembly operable to latch the second access door in the closed position and releasable to permit movement of the second access door to the open position; wherein the latch assembly includes a striker feature on the second access door and a latch secured to the second housing; and
wherein the latch assembly is operatively connected to the magnetic sensor and is configured to release only if the signal from the magnetic sensor indicates that the first access door is in the closed position.

13. The vehicle of claim 12, wherein the magnet is a first magnet and the sensor is a first magnetic sensor; and further comprising:
a second magnet operatively connected to the second access door;
a second magnetic sensor operable to detect proximity of the second magnet relative to the second magnetic sensor; wherein the second magnetic sensor is operatively connected to the second housing; wherein the second magnetic sensor is operable to provide a signal indicative of whether the second access door is in the closed position;
a second latch assembly operable to latch the first access door to the first housing to keep the first access door in the closed position and releasable to permit movement of the first access door to the open position; wherein the second latch assembly includes a striker feature on the first access door and a latch secured to the first housing; and
wherein the second latch assembly is operatively connected to the second magnetic sensor and is configured to release only if the signal from the second magnetic sensor indicates that the second access door is in the closed position.

14. The vehicle of claim 13, wherein the first energy storage device is a fuel tank and the second energy storage device is a battery.

15. The vehicle of claim 13, further comprising:
a vehicle information center; wherein the first magnetic sensor and the second magnetic sensor are operatively connected to the vehicle information center; and
wherein the vehicle information center is operable to provide sensory alerts in response to the signals.

16. The vehicle of claim 12, wherein the access door has a hinge portion and is hinged to the housing at the hinge portion.

17. The vehicle of claim 13, wherein the second access door has a hinge portion and is hinged to the second housing at the hinge portion of the second access door; and wherein the second magnet is in the second access door.

* * * * *